United States Patent [19]

Housley

[11] Patent Number: 5,057,491
[45] Date of Patent: Oct. 15, 1991

[54] HIGH CURRENT DENSITY TUNNEL JUNCTION FABRICATION FROM HIGH TEMPERATURE SUPERCONDUCTING OXIDES

[75] Inventor: Robert M. Housley, Pasadena, Calif.

[73] Assignee: California Institute of Technology, Pasadena, Calif.

[21] Appl. No.: 134,160

[22] Filed: Dec. 16, 1987

[51] Int. Cl.$^5$ ............................................. H01B 12/00
[52] U.S. Cl. ...................................... 505/1; 505/778; 505/780; 357/5
[58] Field of Search ................ 357/5; 505/1, 778, 780

[56] References Cited

PUBLICATIONS

Materials Research Society Symposium Proceedings, Vol. 99, Nov. 30–Dec. 4, 1987, "Use of High Temperature Superconductors in High Speed Electronic Switches with Current Gain," by Biegel et al., pp. 873–876.

Condensed Matter, Zeitschrift für Physik. B, 66 pp. 141–146, (1987), "Superconductivity at 40 K in $La_{1.8}Sr_{0.2}CuO_4$" by Politis et al.

Japanese Journal of Applied Physics, vol. 26, No. 4, Apr., 1987, pp. L460–L462, "Electronic Structures and Superconducting Mechanism of $Ba_2Y_1Cu_3O_7$", by Ihara et al.

Appl. Phys. Lett. 51(2), Jul. 13, 1987, pp. 139–141, "Effects of Radiation Damage in Ion-Implanted Thin Films of Metal-Oxide Superconductors", by Clark et al.

Primary Examiner—Rolf Hille
Assistant Examiner—Steven Loke
Attorney, Agent, or Firm—David W. Collins

[57] ABSTRACT

High current density tunnel junction devices (12) are fabricated by ion implantation of ions (26) to form buried semiconducting layers (24) in originally homogeneous high temperature superconducting oxide layers (18) formed on superconducting oxide substrates (14). Contacts (20, 22) are made to the oxide substrate and to the oxide layer. In an alternative embodiment, the junction devices (12') are fabricated by ion implantation of ions in portions of the substrate. In this embodiment, contacts are made to the oxide substrate and to portions of the substrate overlying the buried semiconducting junctions.

18 Claims, 2 Drawing Sheets

HIGH CURRENT DENSITY TUNNEL JUNCTION FABRICATION FROM HIGH TEMPERATURE SUPERCONDUCTING OXIDES

TECHNICAL FIELD

The present invention relates to thin film or single crystal superconducting devices, and, more particularly, to such devices employing high temperature superconducting oxides.

BACKGROUND ART

Recently, metallic oxides in composition ranges described by $La_{2-x}A_xCuO_4$, where A can be Ba, Sr, or Ca, were found which exhibit superconductivity with transition temperatures $T_C$ as high as 40 K. This sparked a flurry of activity and led to the discovery of another new class of superconducting metallic oxides which can be described by the formula $LnBa_2Cu_3O_7$, where Ln can be Y or any of the trivalent rare earth elements. Several reports of materials with still higher transition temperatures remain to be confirmed.

As a consequence of this work, low cost applications of superconductivity may now be possible. One such application considered is disclosed in a paper by R. H. Koch et al, "Quantum interference devices made from superconducting oxide thin films", Applied Physics Letters, Vol. 51 (3), pp. 200-202 (July 20, 1987).

Koch et al disclose the fabrication of superconducting quantum interference devices (dc SQUID's) from thin films of the superconducting oxide $YBa_2Cu_3O_Y$. The devices were made by first lithographically patterning an ion implant mask containing a $40 \times 40$ $\mu m$ loop and two 17-$\mu m$-wide weak links over a 1-$\mu m$-thick oxide film. An ion beam was used to destroy the superconductivity in the film surrounding the device without actually removing material, resulting in a completely planar structure for the SQUID's.

The authors note that a Josephson tunnel junction device would be preferable to a weak link SQUID, but due to the technical difficulties in making quality junctions and the simplicity in fabricating weak link SQUID's, the latter approach was taken.

It is well-known that Josephson tunnel junction devices offer a much larger variety of applications than weak link SQUID's. Further, most potential applications of high temperature superconductors in advanced microelectronic circuits will require tunnel junctions capable of carrying high critical current densities. Development of reliable techniques for producing such junctions has been a limiting factor even for the use of conventional metal superconductors.

Known techniques have always involved the formation or deposition of a very thin insulating barrier on a superconducting substrate and then depositing another superconducting layer on top of the barrier layer. There appears to be little prospect that these known techniques for producing satisfactory tunnel barriers can be adapted to the new high $T_C$ superconducting oxides, because the latter materials must be annealed at high temperatures following deposition, which will almost certainly destroy any sufficiently thin barrier.

DISCLOSURE OF INVENTION

In accordance with the invention, high current density tunnel junction devices are fabricated by ion implantation to form buried semiconducting layers in originally homogeneous high temperature superconducting oxide films or crystal wafers.

Also in accordance with the invention, a process is provided for forming such devices comprising:
(a) forming the oxide layer;
(b) forming a patterned isolating insulation layer on a surface of the oxide layer defining device regions;
(c) implanting an ion species into the oxide layer at a sufficient density and dose to form an ion-implanted region at a depth below the surface of said oxide layer to form a thin buried tunnel junction region by converting a thin buried layer of superconducting oxide to semiconducting material; and
(d) forming contacts to the oxide layer and to portions of the oxide layer overlying the ion-implanted region.

A variation of the above device may be fabricated by forming a second oxide layer of the same composition in the device regions, implanting the ions into the second oxide layer, and forming the contacts to both the first oxide layer, and to the second oxide layer.

Formation of such buried layers in superconducting materials by ion implantation permits fabrication of tunnel junctions and hence fabrication of a variety of devices based on tunnel junction technology.

BEST MODES FOR CARRYING OUT THE INVENTION

Figure 1:
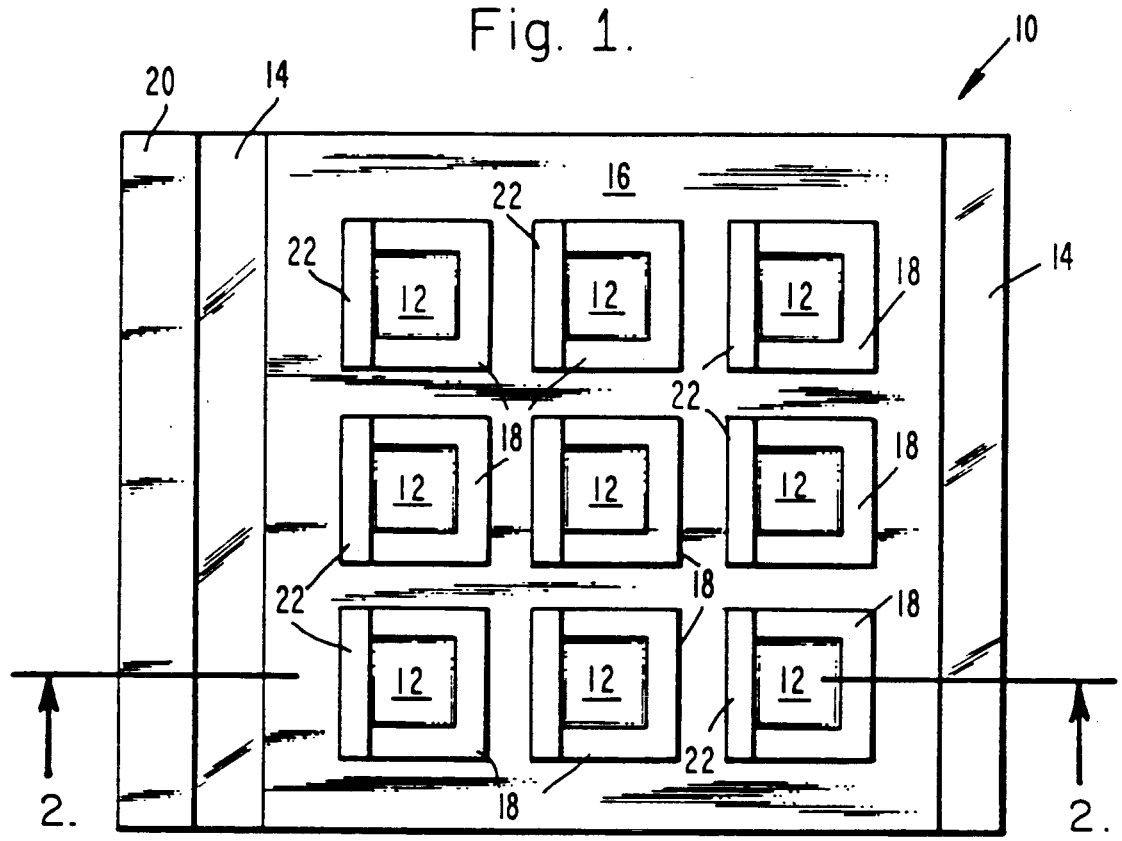
FIG. 1 is a top plan view of an array of tunnel junction devices produced in accordance with the invention.
Figure 3:
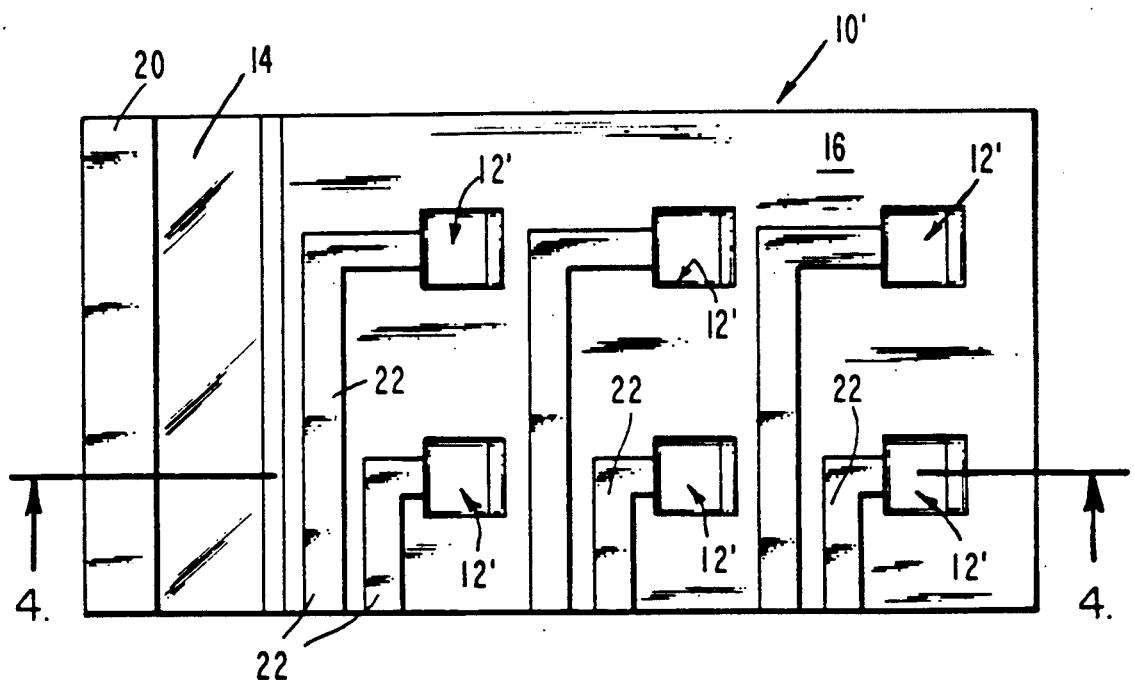
FIG. 3 is a view similar to that of FIG. 1, depicting an alternate embodiment.

Referring now to the drawings wherein like numerals of reference designate like elements throughout, an array of tunnel junctions, shown generally at 10 in FIG. 1 and 10' in FIG. 3, comprises a plurality of tunnel junction devices 12, 12', respectively. Each device 12, 12' is formed on a substrate 14 of superconducting material, having a substantially uniform composition and of single crystalline or near-single crystalline quality.

Examples of suitable substrates 14 include the newly-discovered superconducting compositions comprising $La_{2-x} Sr_xCuO_4$, where substitutions may be made for strontium. Other examples of suitable compositions are $YBa_2Cu_3O_7$, where various rare earth elements may be substituted for Y. However, as other compositions are developed having a sufficiently high $T_C$, such other compositions may also be suitably employed in the practice of the invention. Preferably, suitable compositions are those having a $T_C$ above the boiling point of liquid nitrogen (i.e., $>77$ K) to permit their use in low cost applications.

The substrate 14 may be formed by any of the processes suitable in forming single crystals of the high $T_C$ superconducting oxides. For example, liquid phase epitaxy utilizing low temperature fluxes may be used to grow thin layers of $La_{2-x}A_xCuO_4$ compositions, where A is selected from the group consisting of Sr, Ba and Ca, or $LnBa_2Cu_3O_7$ compositions, where Ln is selected from the group consisting of Y and the trivalent rare earth elements, on strontium titanate or other suitable substrates. Other examples are the growth of the same materials as thin layers onto the same substrates by sputter deposition, electron beam evaporation or laser evaporation. The use of a process for forming the substrate 14 of superconducting oxide on a growth substrate (not shown) requires that the two materials be closely lattice-matched for optimum single crystal growth, as is well-known.

The composition of the superconducting oxide 14 and that of the growth substrate, if utilized, is not part of the invention. However, the foregoing discussion is provided to enable the person skilled in the art to assess the possibility of use of potential candidate materials in the devices disclosed herein.

Figure 4:
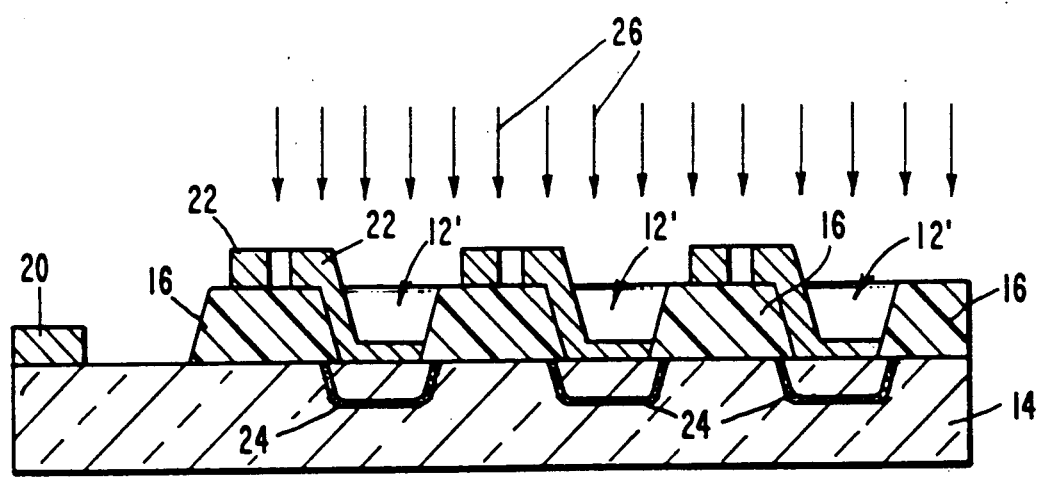
FIG. 4 is a cross-sectional view taken along the line 4—4 of FIG. 3.

By means of conventional lithographic processes, an insulation layer 16, such as MgO, is formed on the surface of the superconducting oxide substrate 14 and patterned to form isolation regions. In one embodiment, shown in FIGS. 1 and 2, after suitable masking and patterning, a layer 18 of the same superconducting oxide is formed, partially contacting the underlying substrate 14. The insulation regions 16 provide isolation between neighboring devices 12. An alternative configuration not requiring the second deposition of superconducting oxide 18 is shown in FIGS. 3 and 4.

Again by means of conventional lithography, noble metal contacts 20, 22, such as gold, are formed, the former contacting the substrate 14 and the latter contacting either the superconducting layer 18 (in the configuration depicted in FIGS. 1 and 2) or those portions of the superconducting substrate 14 overlying a tunnel junction 24 (in the configuration depicted in FIGS. 3 and 4), formed by ion implantation, described below. The metal contacts 20, 22 may or may not already be in place for the ion implantation.

The tunnel junction 24 is formed in each device 12 by implantation of suitable ions 26. The success of ion implantation to form the tunnel junctions 24 depends on (1) good critical current densities being achieved even with barriers several hundred Angstroms thick, so long as they are semiconducting with a small energy bandgap or otherwise permit substantial tunneling of pairs or quasiparticles and (2) conversion of high $T_C$ superconducting oxides from superconductors into the equivalent of such narrow band-gap semiconductors by small changes in composition or changes in local short range order during implantation of $10^{13}$ to $10^{18}$ ions/cm$^2$.

In one embodiment, the I-V characteristics of the superconducting layer 18 may be monitored during the ion implantation at low temperature to determine the optimum dose.

Suitable ions used in the ion implantation 26 are chlorine and fluorine, which substitute for oxygen. However, many other ions, such as arsenic, oxygen, and alkali metals, may be alternately utilized, as appropriate. The energy of ion implantation is about 100 keV to 5 MeV. Optimum dose for each species and implantation energy is determined from the in situ monitoring of low temperature I-V characteristics in the superconducting state.

Figure 2:
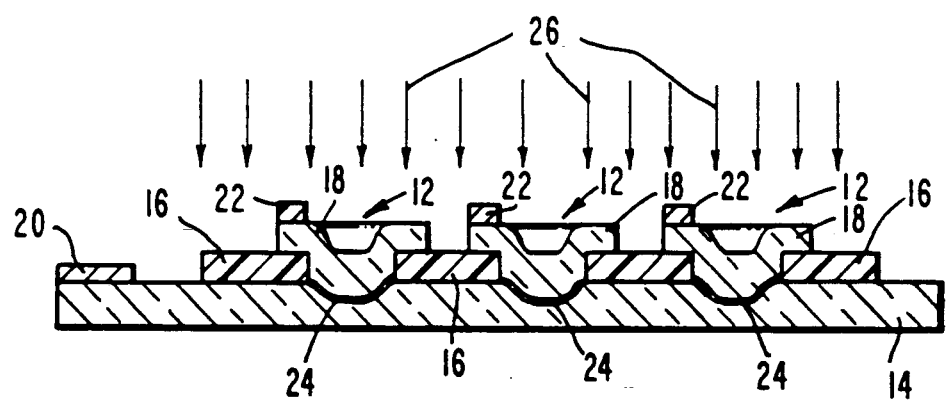
FIG. 2 is a cross-sectional view taken along the line 2—2 of FIG. 1.

The resulting junction 24 is formed to a thickness of a few hundred Angstroms and at a depth ranging from about about 0.1 to 1 μm below the surface of the superconducting material (layer 18 in FIGS. 1 and 2; layer 14 in FIGS. 3 and 4).

With the proper choice of implanting ions and implantation parameters, such as crystallographic orientation, the passage of ions through the upper part of the layer superconducting layer (layer 18 in FIGS. 1 and 2; layer 14 in FIGS. 3 and 4) is not expected to damage that portion sufficiently to adversely affect its superconducting nature. However, in the event that this is not the case, a light anneal at about 400° C. may be used to heal the damage and restore the superconducting properties of the layer 18 (or layer 14) above the tunnel junction 24.

INDUSTRIAL APPLICABILITY

Superconducting materials with ion-implanted tunnel junctions are expected to find use in a wide variety of applications requiring combinations of planar superconducting devices and microelectronic circuits.

Thus, there has been disclosed a high current density tunnel junction device fabricated by deep ion implantation to form a buried semiconducting layer in an originally homogeneous high temperature superconducting oxide film or crystal. It will be apparent to those of ordinary skill in the art that various modifications and changes of an obvious nature may be made, and all such changes and modifications are intended to fall within the scope of the invention as defined by the appended claims.

What is claimed is:

1. A two-terminal high current density tunnel junction device consisting essentially of:
   (a) a first oxide layer consisting essentially of a high temperature superconducting oxide;
   (b) a barrier layer formed between said first oxide layer and a second oxide layer having the same composition as said first oxide layer, said barrier layer having the same composition as said first and second oxide layers but having semiconducting properties provided by ions therein to form a tunnel junction; and
   (c) a pair of electrical contacts, one contacting said first oxide layer and the other contacting said second oxide layer.

2. The device of claim 1 wherein said second oxide layer is a separate layer formed on said first oxide layer.

3. The device of claim 1 wherein said second oxide layer is part of said first oxide layer and is separated therefrom by said barrier layer.

4. The device of claim 1 wherein said superconducting oxide layer comprises $La_{2-x}A_xCuO_4$, where A is selected from the group consisting of Ba, Sr and Ca, having a $T_C$ of at least about 40K.

5. The device of claim 4 wherein A is Sr.

6. The device of claim 1 wherein said superconducting oxide layer consists essentially of $LnBa_2Cu_3O_7$, where Ln is at least one element selected from the group consisting of yttrium and the trivalent rare earths, said layer having a $T_C$ of at least about 90K.

7. The device of claim 6 wherein Ln is Y.

8. The device of claim 1 wherein said ions are selected from the group consisting of elements which induce the transition from the superconducting to the semiconducting state.

9. The device of claim 8 wherein said ions are selected from the group consisting of F, As and O.

10. An array of two-terminal high current density tunnel junction devices, each device consisting essentially of:
   (a) a first oxide layer consisting essentially of a high temperature superconducting oxide;

(b) a barrier layer formed between said first oxide layer and a second oxide layer having the same composition as said first oxide layer, said barrier layer having the same composition as said first and second oxide layers but having semiconducting properties provided by ions therein to form a tunnel junction; and (c) a pair of electrical contacts, one contacting said first oxide layer and the other contacting said second oxide layer.

11. The array of claim 10 wherein said second oxide layer is a separate layer formed on said first oxide layer.

12. The array of claim 10 wherein said second oxide layer is part of said first oxide layer and is separated therefrom by said barrier layer.

13. The array of claim 10 wherein said superconducting oxide layer comprises $La_{2-x}A_xCuO_4$, where A is selected from the group consisting of Ba, Sr and Ca, having a $T_C$ of at least about 40K.

14. The array of claim 13 wherein A is Sr.

15. The array of claim 10 wherein said superconducting oxide layer consists essentially of $LnBa_2Cu_3O_7$, where Ln is at least one element selected from the group consisting of yttrium and the trivalent rare earths, said layer having a $T_C$ of at least about 90K.

16. The array of claim 15 wherein Ln is Y.

17. The array of claim 10 wherein said ions are selected from the group consisting of elements which induce the transition from the superconducting to the semiconducting state.

18. The array of claim 17 wherein said ions are selected from the group consisting of F, As and O.

* * * * *